United States Patent [19]
Estes

[11] Patent Number: 5,889,835
[45] Date of Patent: Mar. 30, 1999

[54] METHOD AND SYSTEM FOR TESTING A TRANSMISSION LINE IN A NON-ADDRESSABLE NETWORK FOR CONTINUITY

[75] Inventor: Daniel L. Estes, Lawrenceville, Ga.

[73] Assignee: BellSouth Corporation, Atlanta, Ga.

[21] Appl. No.: 969,381

[22] Filed: Nov. 13, 1997

[51] Int. Cl.$^6$ .......................... H04M 1/24; H04N 17/00; G01R 31/11; H03H 5/00

[52] U.S. Cl. .................................. 379/26; 379/5; 379/29; 348/6; 348/182; 455/3.1; 333/26; 324/533; 324/523

[58] Field of Search .................................. 379/1, 5, 6, 22, 379/24, 26, 27, 28, 29; 348/6, 182, 183; 455/3.1; 324/512, 523, 527, 532, 533, 534; 333/25, 26; 370/401, 402, 241, 242, 249

[56] References Cited

U.S. PATENT DOCUMENTS

| | | | |
|---|---|---|---|
| 5,128,619 | 7/1992 | Bjork et al. ................................ | 379/26 |
| 5,514,965 | 5/1996 | Westwood ................................ | 324/533 |
| 5,712,897 | 1/1998 | Ortel ........................................ | 379/27 |
| 5,790,523 | 8/1998 | Ritchie, Jr. et al. ..................... | 455/3.1 |

*Primary Examiner*—Paul Loomis
*Attorney, Agent, or Firm*—Jones & Askew, LLP

[57] ABSTRACT

A method and system for testing the continuity of a transmission line in a non-addressable network. A method and system in a communications service environment are provided, the environment including an addressable network and a non-addressable network, for testing transmission line continuity in the non-addressable network. In an embodiment, a signal generator connected to a first transmission line in the addressable network generates a signal on the first transmission line. The first transmission line is connected to a second transmission line in the non-addressable network by a bridge. The bridge transfers the signal from the first transmission line to the second transmission line. The system also includes a signal receiver connected to the second transmission line for receiving the signal over the second transmission line when the second transmission line is continuous. The receipt of the signal over the second transmission line at the signal receiver indicates that the second transmission line is continuous.

19 Claims, 3 Drawing Sheets

METHOD AND SYSTEM FOR TESTING A TRANSMISSION LINE IN A NON-ADDRESSABLE NETWORK FOR CONTINUITY

FIELD OF THE INVENTION

The present invention generally relates to transmission line continuity testers, and more particularly relates to a method and system for utilizing the benefits of an addressable network to test the continuity of a transmission line in a non-addressable network.

BACKGROUND OF THE INVENTION

Cable television has become a staple product in many homes. An estimated 60–65% of all American households now receive cable service. Cable companies install extensive cable networks to provide cable service. A typical cable network includes four main elements: a headend, a trunk system, a distribution system, and subscriber drops. The headend receives cable programming from many sources, including satellite, over-the-air local station signals, and terrestrial microwave links. The headend processes the received programming and delivers it over the trunk system, which is the main transmission artery of the cable network. The transmission lines of a modem trunk system are typically a combination of coaxial cable and fiber optic cable. The trunk system branches into a number of distribution systems. The transmission lines of the distribution system are also generally a combination of coaxial cable and fiber optic cable. The distribution system delivers the programming from the trunk system into individual subscriber areas. The distribution system is also called the "feeder."

The distribution system terminates in the subscriber area at a distribution point, such as an optical network unit. A subscriber drop completes the connection from the distribution point to the subscriber location, typically a house or apartment. Due to the current economic limitations of fiber optics, the subscriber drop transmission line from the distribution point to the subscriber location is generally coaxial cable.

The cable network generally ends at the junction between the subscriber drop and the subscriber location. The subscriber is responsible for finishing the connection within the subscriber location. Generally, coaxial cable is used as the transmission line to distribute the cable programming to television sets within the subscriber's location. Often, a set-top box is used within the subscriber location to decode signals for premium channels, pay-per-view or the like.

To provide cable service to cable subscribers, a cable company must install and maintain hundreds or thousands of miles of transmission lines. Both fiber optic cable and coaxial cable transmission lines are used in abundance in a typical cable network. Consequently, cable companies are constantly striving to create new methods to simplify and reduce the costs of the maintenance process. Much of the burden of maintaining the cable network involves ensuring a continuous transmission line from the headend to the subscriber location. For the purpose of this discussion, a continuous transmission line is one which provides an uninterrupted electrical path from one end of the transmission line to the distal end of the transmission line.

A typical maintenance problem takes the following form. A subscriber calls the cable company to announce a problem with the subscriber's service. Perhaps the subscriber thinks that he or she is not receiving a signal at all. Once the cable company receives the call, it must proceed to troubleshoot the problem. Usually, the first step to troubleshoot the problem is to ensure that the cable connection is continuous from the headend all the way to the subscriber location. The cable company typically has mechanisms in place to test the continuity of the transmission line from the headend to the distribution point. However, testing the continuity of the transmission line from the distribution point to the subscriber's location can be difficult. Often the testing requires sending a field technician to the subscriber's location to manually test the conductivity of the transmission line with continuity testers.

The telecommunications industry has addressed the similar problem of testing telecommunications transmission lines for continuity from a service provider to a subscriber location, and developed a workable method for testing the continuity remotely, usually without having to dispatch a field technician. In a telecommunications maintenance situation similar to that above, a service provider can electrically test a unique telecommunications transmission line. If the transmission line contains a discontinuity, such as an open or a short, the discontinuity is detected at a testing location. By using measurement devices at the testing location, the service provider can measure the characteristics of a reflected signal, and, based on those characteristics, can pin-point a discontinuity practically anywhere along the transmission line to the subscriber's location. However, there are important distinctions between a telecommunications network and a cable network which make a similar testing scheme unworkable if applied to a cable network.

Each subscriber in a telecommunications network is individually addressable. For the purposes of this discussion, the term "addressability" means the ability for a service provider to identify and transmit a signal to a particular subscriber in the network without transmitting that signal to any other subscriber in the network. Accordingly, the service provider can establish a circuit from the testing location directly to a particular subscriber, in similar fashion to establishing a telephone call between two subscribers. The established circuit spans only the transmission lines between the testing location and the particular subscriber, and signals communicated over the circuit travel along only those transmission lines. In this manner, the tested transmission path applies to the particular subscriber, but not other subscribers in the telecommunications network. Consequently, a reflected signal on that circuit can only result from a discontinuity in the transmission lines supporting the circuit between the testing location and that particular subscriber.

In contrast, a cable network is distributive and generally nonaddressable. For the purpose of this discussion, the term "non-addressability" means the inability to identify and transmit a signal to a particular subscriber in the network without transmitting that signal to more than one subscriber in the network. In the cable network, a common set of programming signals is distributed from the headend to every subscriber. The cable network topology in use by most cable companies today does not include a manageable way to transmit a tone along a particular transmission line to a particular subscriber. Attempting to send a tone to only a particular subscriber is difficult if not impossible because the subscribers are not individually addressable. Sending a test signal into a transmission line in the cable network simultaneously transmits the signal to all of the subscribers downstream from the distribution point (if the signal were generated at the distribution point). If a reflected signal occurred, the cable company could not identify on which transmission line the signal was reflected. Consequently, the cable industry cannot use the testing scheme of the telecommunications industry to test the continuity of a transmission line from the cable company headend to the termination of the cable network at the subscriber location.

A method and system for remotely testing the continuity of a transmission line in a non-addressable network has eluded those skilled in the art. Accordingly, a need exists for a method and system to create the ability to remotely test a transmission line for continuity all the way through a non-addressable network, such as a cable network, to a subscriber location.

SUMMARY OF THE INVENTION

One aspect of the present invention is a system in a communications service environment, including an addressable network and a non-addressable network, for testing transmission line continuity in the non-addressable network. The system can include a signal generator connected to a first transmission line in the addressable network for generating a signal on the first transmission line. The first transmission line is connected to a second transmission line in the non-addressable network by a bridge. The bridge is operative to transfer the signal from the first transmission line to the second transmission line. The system also includes a signal receiver connected to the second transmission line for receiving the signal over the second transmission line when the second transmission line is continuous. The receipt of the signal over the second transmission line at the signal receiver indicates that the second transmission line in the non-addressable network is continuous.

Another aspect of the present invention is an apparatus to enable testing transmission line continuity in a communications service environment including an addressable network and a non-addressable network. The apparatus includes a bridge for coupling a first transmission line in the addressable network to a second transmission line in the non-addressable network. A signal introduced on the first transmission line is transferred to the second transmission line in the non-addressable network and will be transmitted over the second transmission line when the second transmission line is continuous, thereby enabling the continuity of the second transmission line in the non-addressable network to be tested.

Yet another aspect of the present invention is a method, in a communications service environment including an addressable network and a non-addressable network, for testing a transmission line in the non-addressable network for continuity. The method generates a signal on a first transmission line of the addressable network; initiates a timer, transmits the signal over the first transmission line to a particular location; transfers the signal at the particular location from the first transmission line to a second transmission line in the non-addressable network; monitors the second transmission line in the non-addressable network for receipt of the signal until the timer times out; and terminates monitoring the second transmission line in the non-addressable network when the timer times out, whereby the receipt of the signal over the second transmission in the non-addressable network indicates that the second transmission line in the non-addressable network is continuous.

Other objects, features, and advantages of the present invention will become apparent upon reading the following description of exemplary embodiments, when taken in conjunction with the drawings and the claims.

DETAILED DESCRIPTION OF THE EMBODIMENTS

The loosening of federal regulations governing the telecommunications and cable industries has created an environment fostering innovative solutions to problems which have plagued the separate industries, such as the instant problem of testing transmission lines in a non-addressable network, such as a cable network. The present invention preferably provides a bridge at a subscriber's location between a first transmission line in an addressable network and a second transmission line in a non-addressable network. In this manner, a signal is generated by the addressable network and transmitted directly to the subscriber's location over the first transmission line, without being transmitted to other subscribers. The bridge transfers the signal from the first transmission line to the second transmission line in the non-addressable network. A monitoring station monitors the second transmission line for receipt of the signal. The receipt of the signal over the second transmission line indicates the second transmission line is continuous. The failure to receive the signal over the second transmission line indicates that the second transmission line is not continuous.

By making use of the addressability of the addressable network, the preferred embodiments transmit the signal to only the subscriber location of interest, rather than broadcasting the signal to all of the downstream subscribers, as would be necessary if the signal were generated by the non-addressable network. The bridge allows the signal to be introduced only on the second transmission line, but not the remaining transmission lines in the non-addressable network. A monitoring station or testing station monitors the second transmission line, and receives the signal if the second transmission line is continuous. Accordingly, the present invention overcomes the shortcomings of the non-addressable network by utilizing the benefits of the addressable network, thereby creating a system which can remotely test the continuity of transmission lines in a non-addressable network.

Figure 1:
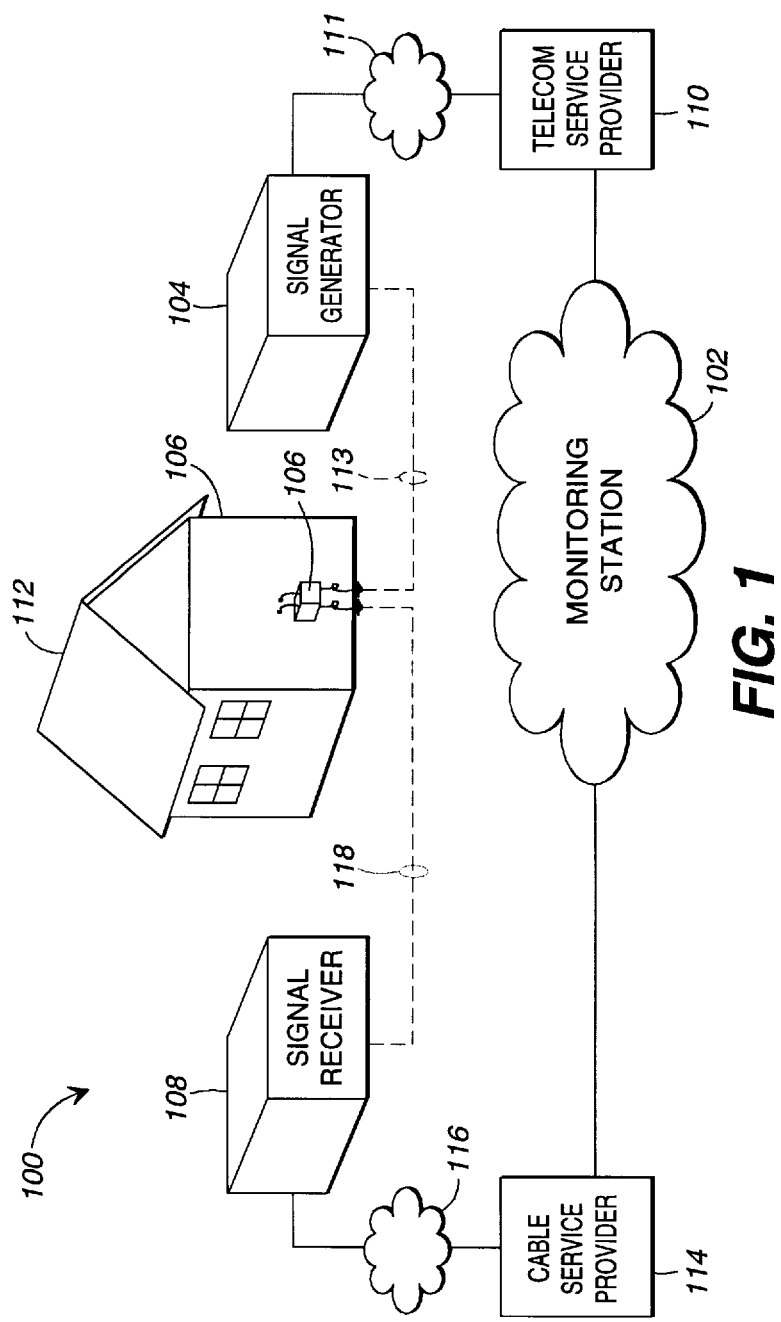
FIG. 1 is a conceptual diagram of a system for testing the continuity of a transmission line constructed in accordance with an exemplary embodiment of the present invention.

FIG. 1 illustrates an exemplary embodiment of the present invention. The exemplary embodiment is a system 100 for testing the continuity of a transmission line in a non-addressable network. The system 100 includes a monitoring station 102 in contact with both a cable service provider 114 and a telecommunications service provider 110. The telecommunications service provider 110 has an addressable network 111 installed to support telecommunications service provided to subscribers in the addressable network 111. Within the addressable network is a signal generator 104. The addressable network 111 is connected to subscriber location 112 by a first transmission line 113, which preferably terminates at a bridge 106.

The bridge 106 couples the first transmission line 113 in the addressable network 113 to preferably the terminal end of a second transmission line 118. The second transmission line 118 connects the subscriber location 118 to a non-addressable network 116. The non-addressable network 116 is installed by a cable service provider 114 to support the distribution of the cable service to subscribers. Within the non-addressable network 116 is a signal receiver 108 connected to the second transmission line 118.

The monitoring station 102 can be a service center established to support the maintenance of a communications service environment. The communications service environment can include both a telecommunications service provider 110 and a cable service provider 114, or a single provider of both cable and telecommunications services. The monitoring station 102 can be a service center, a cable company, or any acceptable entity or mechanism, either manual or automated, capable of directing the testing performed by the exemplary embodiment.

In the exemplary embodiment, the monitoring station 102 is connected to the telecommunications service provider 110. The telecommunications service provider 110 makes use of the addressable network 111 to provide telecommunications service to subscribers in the network, such as subscriber location 112. Subscribers in the addressable network 111 are individually addressable. The addressable network 111 allows the telecommunications service provider 110 to establish a circuit between any two locations in the addressable network 111, such as between signal generator 104 and subscriber location 112. The circuit allows a signal to be transmitted directly to subscriber location 112 over the circuit without being transmitted to the other subscribers in the addressable network 111.

Within the addressable network 111 is the signal generator 104. The signal generator 104 is capable of transmitting a signal over a circuit established by the telecommunications service provider 110 to any particular subscriber location within the addressable network, such as subscriber location 112. The monitoring station 102 preferably is in control, via the telecommunications service provider 110, of the signal generator 104. Alternatively, the signal generator 104 can be controlled by an automated mechanism, or under control of the telecommunication service provider 110 directly.

The signal generator 104 of the exemplary embodiment is configured to transmit a signal over any of the transmission lines in the addressable network 111 from the signal generator 104 to the subscriber locations beyond the signal generator (the "downstream transmission lines"). One such downstream transmission line is the first transmission line 113. In the exemplary embodiment, the signal transmitted by the signal generator 104 is a tone in the frequency range above the range of human hearing so that the signal will not interfere with other signals transmitted over the addressable network 111 during normal operation. The signal is most preferably above 5 MHz, such as approximately a 10 MHz tone.

High frequency signals, such as those in the exemplary embodiment, suffer from increased attenuation compared to signals within the frequency range of human hearing when transmitted over twisted pair copper wiring. Accordingly, in the exemplary embodiment, it is preferred that the signal generator 104 be located near the subscriber location 112. However, for embodiments without the attenuation problem of the exemplary embodiment, the location of the signal generator 104 can be any acceptable location which allows a signal to be introduced on the first transmission line 113. In the exemplary embodiment, an acceptable location for the signal generator can be within either a digital loop carrier or a central office environment. The test signal can be delivered over the same facilities as those which provide the telecommunications service to the subscriber location 112.

The monitoring station 102 of the exemplary embodiment is also in contact with a cable service provider 114. The telecommunications service provider 110 can be related to the cable service provider 114, or even be the same company.

The cable service provider 114 makes use of a non-addressable network 116 to distribute cable programming to subscriber locations, such as subscriber location 112. The non-addressable network 116 generally does not provide the cable service provider 114 with the ability to transmit a signal directly to only a particular subscriber location, such as subscriber location 112. Within the non-addressable network 116 is a signal receiver 108 tuned to receive a signal at the transmission frequency of the signal generator 104.

Due to the relatively high frequency of the signal generated by the signal generator 104 of the exemplary embodiment, the signal receiver 108 preferably should be located proximate to the subscriber location 112 to avoid excessive attenuation of the signal. In an exemplary embodiment, an appropriate location for the signal receiver is within an Optical Network Unit, as defined by Bellcore Technical Reference TR-TSY-00909, in the non-addressable network 116, or some other suitable location proximate to the subscriber location 112. However, as with the signal generator 104 discussed above, in alternative embodiments where attenuation is not problematic, or where the attenuation is compensated for in some manner, the location of the signal receiver 108 can be any acceptable location for receiving the signal over the second transmission line 118.

The signal receiver 108 is preferably configured to indiscriminately receive signals transmitted over any of the downstream transmission lines of the non-addressable network 116, such as the second transmission line 118. Each of the transmission lines of the non-addressable network is preferably coupled, with a bridge 106, to a corresponding one of the transmission lines of the addressable network 111 at a subscriber location, such as subscriber location 112. The signal receiver 108 is capable of notifying the monitoring station 102, via the cable service provider 114, that a signal was received over any of the downstream transmission lines, such as the second transmission line 118.

It is unnecessary that the signal receiver 108 be able to detect over which of the downstream transmission lines a signal received by the signal receiver 108 was transmitted, because the monitoring station 102 preferably will make that determination. In the exemplary embodiment, the monitoring station 102 directs the telecommunications service provider 110 to establish a circuit between the signal generator 104 and a particular subscriber location 112. Then the monitoring station 102 directs the signal generator 104 to transmit a signal over that established circuit. The monitoring station 102 is in control of the signal generator 104, and will direct it to transmit a signal only to subscriber location 112. Therefore, the only transmission line in the non-addressable network 116 over which the signal receiver 108 receives a signal is the second transmission line 118. Accordingly, so long as the monitoring station 102 does not direct the signal generator 104 to transmit a signal over more than a single transmission line in the addressable network 111, then the signal receiver 108 only has one signal which can be received over the plurality of downstream transmission lines in the non-addressable network 116. As a result, the monitoring station 102 understands that if the signal receiver 108 reports the receipt of a signal, then the signal must have come from the signal generator 104.

Those skilled in the art will appreciate that the system 100 can include a large number of signal generators and signal receivers. It is also possible that some signal receivers will overlap with more than one signal generator. As a result, the transmission lines in the addressable network 111 associated with a single signal generator may have corresponding transmission lines in the addressable network 111 serviced by more than one signal receiver, and vice versa. Consequently, it is a design consideration to ensure that the monitoring station 102 is apprised of which signal receiver in the non-addressable network 116 corresponds to which signal generator in the addressable network 111. In this manner, the monitoring station 102 can conduct multiple simultaneous tests, so long as it does not create a situation where the signal receiver 108 can receive signals over more than one downstream transmission line from one or more signal generators in the addressable network 111. In other words, the system 100 should ensure that during a test, the addressable network 111 only generates unique signals which a particular signal receiver 108 can receive over its associated downstream transmission lines.

Figure 2:
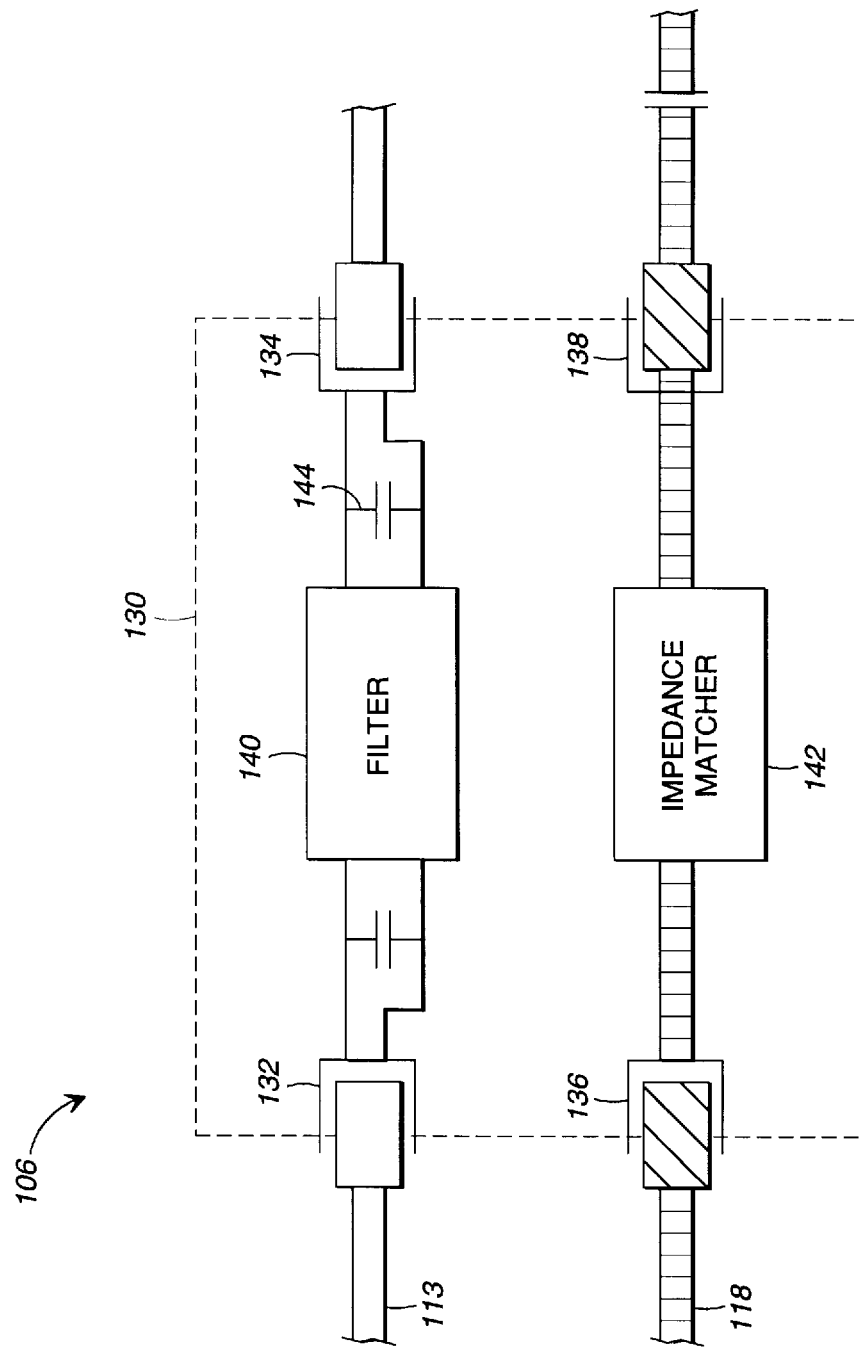
FIG. 2 is functional block diagram of the bridge portion of the embodiment described in FIG. 1.

FIG. 2 is a functional block diagram of the bridge 106 of the exemplary embodiment. The bridge 106 is preferably the component of the system 100 that couples the first transmission line 113 to the second transmission line 118, thereby coupling the addressable network 111 to the non-addressable network 116. In essence, the bridge 106 acts as a transceiver at the subscriber location 112 which responds to a signal transmitted on the first transmission line 113 by repeating the signal on the second transmission line 118. As discussed above, receiving the signal verifies the continuity of the second transmission line 118.

The bridge 106 is installed at the subscriber location 112 between the first transmission line 113 of the addressable network 111, and the second transmission line 118 of the non-addressable network 116. The bridge 106 preferably resides in a housing 130. The housing 130 may be attached to the structure of the subscriber location 112, or be otherwise located at the subscriber location 112 such that the terminal ends of both the first transmission line 112 and the second transmission line 118 are accessible.

The housing 130 preferably is a multi-port unit having a plurality of connections for receiving the transmission lines of the addressable and non-addressable networks. In the exemplary embodiment, the housing 130 includes two telephony connectors, an entering connector 132 for receiving the first transmission line 113, and an exiting connector 134 for connecting the first transmission line 113 to the subscriber location 112. A typical connector in use in such an addressable network is the REJ-11C connector for twisted pair copper wiring. The housing 130 also includes two coaxial cable connectors, an entering connector 136 for receiving the second transmission line 118, and an exiting connector 138 for connecting the second transmission line 118 to the subscriber location 112. Typical connectors in use in such a non-addressable network are F-connector ground blocks.

The first transmission line 113 is connected to the housing 130 at entering connector 132. The first transmission line 113 passes through a filter 140 and to the exiting connector 134. In the exemplary embodiment, the filter 140 is a bandpass filter tuned to extract a signal transmitted over the first transmission line 113. The filter 140 characteristics are such that a signal having a frequency above a certain threshold is transferred to an impedance matcher 142 to be introduced on the second transmission line 118. All other signals on the first transmission line 113 below the threshold frequency pass through the filter 140 and are forwarded to the subscriber location 112 via exiting connector 134. A circuit protector 144 preferably is included to protect any equipment connected to the first transmission line 113 in the subscriber location 112 from voltage and current surges. From connector 134, the first transmission line 113 is connected to subscriber location 112.

The filter 140 is connected to the impedance matcher 142, which transfers the signal from the filter 140 to the second transmission line 118. In the exemplary embodiment, the impedance matcher 142 adjusts for different impedance characteristics between the first transmission line 113 and the second transmission line 118. In the exemplary embodiment, the second transmission line 118 is 75 Ohm coaxial cable, and the first transmission line 113 is telephone-standard twisted pair copper wiring.

The second transmission line 118 is passed through the housing 130 from the entering connector 136 to the exiting connector 138 substantially unmodified, except that the impedance matcher 142 creates a transmission path for the signal from the filter 140 to the second transmission line 118. From the exiting connector 138, the second transmission line 118 is connected to subscriber location 112.

In operation, the signal transmitted over the first transmission line 113 enters the bridge 106 at entering connector 132. The filter 140 extracts the signal from the first transmission line 113 and passes the signal to the impedance matcher 142. The impedance matcher 142 transfers the signal to the second transmission line 118 without creating an unwanted impedance drop. Accordingly, the signal is transferred to the second transmission line 118 to be received by the signal receiver 108 when the second transmission line 118 continuous.

Figure 3:
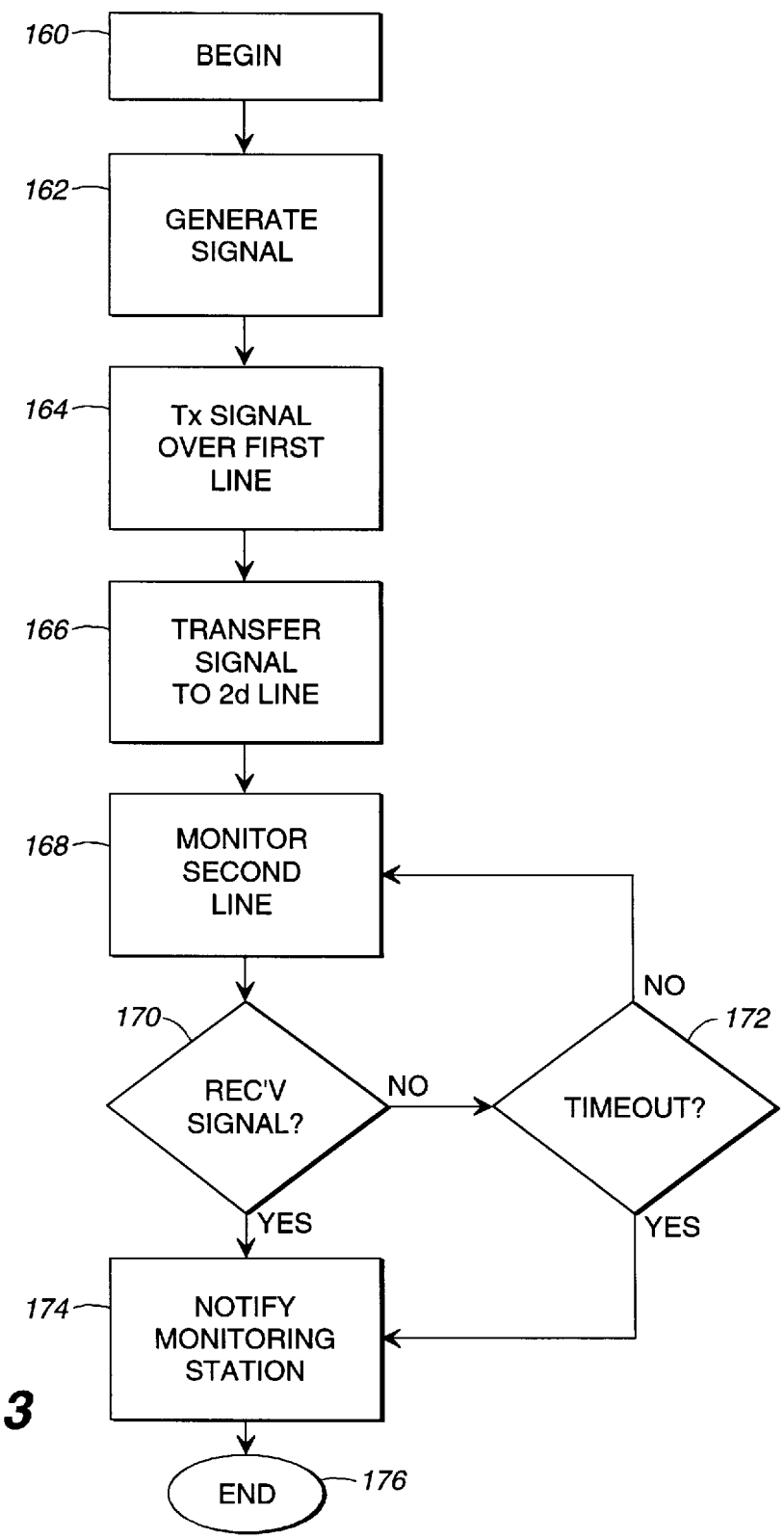
FIG. 3 is a flow chart illustrating an embodiment of the method of testing the continuity of a transmission line.

FIG. 3 is a flow chart illustrating an embodiment of the present invention implemented in a method to test the continuity of a transmission line 118 in the non-addressable network 116. The method enters at beginning block 160. At beginning block 160, the method may receive notice that a maintenance problem exists. Using the previous embodiment for example, the maintenance problem could be that the monitoring station 102 received a service call from subscriber location 112 indicating that the service provided by the non-addressable network 116 to subscriber location 112 is out or malfunctioning. In the exemplary embodiment, the monitoring station 102 is a service center available to both the telecommunications service provider 110 and the cable service provider 114.

In response to the call, the monitoring station 102 first concludes that the continuity of the second transmission line 118 from the distribution point (containing the signal receiver 108) to the subscriber location 112 must be tested. Accordingly, at step 162 the method generates a signal. For example, in the previous embodiment the monitoring station 102 directs the signal generator 104, via the telecommunications service provider 110, to establish a circuit between the signal generator 104 and the subscriber location 112, and to generate and transmit a signal over the first transmission line 113. In the disclosed embodiment, the signal generated is approximately a 10 MHz tone. However, those skilled in the art will understand that other signals and frequencies can be used which will achieve the same result without deviating from the spirit of the present invention.

At step 164, the method transmits the signal generated at step 162 over the first transmission line 113. For example, the signal generator 104 of the previous embodiment transmits the signal over the first transmission line 113. As mentioned above, the relatively high frequency of the signal in the exemplary embodiment renders it desirable to locate the signal generator 104 relatively close to the subscriber location 112 to avoid excessive attenuation between the signal generator 104 and the signal receiver 108.

At step 166, the method transfers the signal from the first transmission line 113 to the second transmission line 118. In the previous embodiment, for example, the bridge 106 transfers the signal from the first transmission line 113 to the second transmission line 118. At that point, the signal has been introduced onto the second transmission line 118 at the terminal end of the non-addressable network 116. When the monitoring station 102 initiates the method, it begins monitoring whether the signal receiver 108 has sent a notification of a received signal, as identified at step 168.

At step 168, the second transmission line 118 is monitored for receipt of the signal. In one embodiment, the monitoring step 168 can include initiating a timer to limit the time that the method waits to determine if the second transmission line 118 is continuous. Those skilled in the art will understand that any method of determining how long the monitoring station 102 should wait for receipt of the signal will satisfy the objectives of the present invention. For instance, a human, such as a maintenance technician, could simply trigger the signal generator 104 to transmit the signal and then wait a predetermined amount of time for a notification that the signal was received.

At decision block 170, the method tests to determine if the signal has been received over the second transmission line 118. In the previous embodiment, for example, the monitoring station 102 tests whether it received notification that the signal was received over the second transmission line 118. If the signal receiver 108 receives the signal, the signal receiver 108 notifies the monitoring station 102, via the cable service provider 114. If the signal is received, the signal receiver 108 preferably sends a "green light" or positive indication that the signal was received to the monitoring station 102. A positive indication terminates the test, and the monitoring station 102 may notify the cable service provider 114 that the second transmission line 118 is continuous.

At decision block 170, if the signal has not been received over the second transmission line 118, the method proceeds to decision block 172, where the method queries whether the timer has timed out. For example, if the monitoring station 102 has not received notification that the signal receiver 108 received the signal, the timer is queried to determine whether it has timed out. If the timer has not timed out, the method proceeds to step 168 and continues to monitor the second transmission line 118, returning to decision block 170, which again performs as stated above. However, if the query at decision block 172 indicates that the timer has timed out, that information is conveyed to the monitoring station 102. Of course, if the timer is a part of the monitoring station 102, then an internal notification will occur, and the test will terminate. If, however, the timer is a part of the signal receiver 108, then a time-out results in the signal receiver 108 preferably sending the monitoring station 102 a "red light" or negative indication. The monitoring station may then notify the cable service provider 114 that the second transmission line 118 is not continuous, and the cable service provider 114 can dispatch a field service technician.

It will be appreciated from the above that the present invention is a method and system for testing a transmission line in a non-addressable network for continuity completely to a subscriber location. From a reading of the description above pertaining to the disclosed embodiment of the present invention, modifications and variations thereto may become apparent to those skilled in the art. Therefore, the scope of the present invention is to be limited only by the following appended claims.

What is claimed is:

1. In a communications service environment including an addressable network and a non-addressable network, a system for testing transmission line continuity in the non-addressable network, comprising:

a signal generator connected to a first transmission line in the addressable network for generating a signal on the first transmission line;

a bridge connected between the first transmission line and a second transmission line in the non-addressable network, the bridge being operative to transfer the signal from the first transmission line to the second transmission line; and a signal receiver connected to the second transmission line for receiving the signal over the second transmission line when the second transmission line is continuous, whereby the receipt of the signal over the second transmission line at the signal receiver indicates that the second transmission line in the non-addressable network is continuous.

2. The system of claim 1, wherein the bridge comprises:

a signal extractor connected to the first transmission line for extracting the signal from the first transmission line and transferring the signal to a coupler; and the coupler associated with the signal extractor and connected to the second transmission line, the coupler being operative for transferring the signal to the second transmission line, whereby the signal extractor extracts the signal from the first transmission line, transfers the signal to the coupler, and the coupler transfers the signal to the second transmission line.

3. The system of claim 1, wherein the bridge comprises:

a coupler connected to the first transmission line, the coupler being operative for creating a transmission path from the first transmission line to a signal extractor; and the signal extractor associated with the coupler and connected to the second transmission line, the signal extractor being operative for extracting the signal from the transmission path, whereby the coupler creates a transmission path from the first transmission line to the signal extractor, and the signal extractor extracts the signal from the transmission path and transfers the signal to the second transmission line.

4. The system of claim 2, wherein the signal extractor is a filter.

5. The system of claim 4, wherein the signal has a frequency that is above the range of human hearing.

6. The system of claim 5, wherein the frequency is above 5 MHz.

7. The system of claim 6, wherein the frequency is approximately 10 MHz.

8. The system of claim 2, wherein the first transmission line and the second transmission line have different impedance characteristics, and wherein the coupler comprises an impedance matcher operative to match the different impedance characteristics.

9. The system of claim 1, wherein the first transmission line comprises twisted pair copper wire.

10. The system of claim 1, wherein the second transmission line comprises coaxial cable.

11. In a communications service environment including an addressable network and a non-addressable network, an apparatus to enable testing transmission line continuity in the non-addressable network, comprising:

a bridge for coupling a first transmission line in the addressable network to a second transmission line in the non-addressable network, whereby a signal introduced on the first transmission line is transferred to the second transmission line in the non-addressable network and will be transmitted over the second transmission line when the second transmission line is continuous, thereby enabling a test to be performed of the continuity of the second transmission line in the non-addressable network.

12. The apparatus of claim 11, wherein the bridge further comprises:

a filter connected to the first transmission line for extracting the signal from the first transmission line; and an impedance matcher connected to the second transmission line and associated with the filter, the impedance matcher being operative to transfer the signal to the second transmission line in the non-addressable network, the impedance matcher also being operative to match a first impedance associated with the first transmission line to a second impedance associated with the second transmission line in the non-addressable network.

13. The apparatus of claim 12, wherein the signal comprises a frequency above 5 MHz, and wherein the filter is tuned to extract the signal.

14. The apparatus of claim 13, wherein the signal comprises a frequency of approximately 10 MHz, and wherein the filter is tuned to extract the signal.

15. The apparatus of claim 12, wherein the first impedance comprises 33 Ohms per 1000 feet of cable, and wherein the second impedance comprises 75 Ohms.

16. In a communications service environment including an addressable network and a non-addressable network, a method for testing a transmission line in the non-addressable network for continuity, comprising the steps of:

generating a signal on a first transmission line of the addressable network;

initiating a timer;

transmitting the signal over the first transmission line to a particular location;

transferring the signal at the particular location from the first transmission line to a second transmission line in the non-addressable network;

until the timer times out, monitoring the second transmission line in the non-addressable network for receipt of the signal; and when the timer times out, terminating the monitoring of the second transmission line in the non-addressable network, whereby the receipt of the signal over the second transmission in the non-addressable network indicates that the second transmission line in the non-addressable network is continuous.

17. The method of claim 16, further comprising the step of:

if the signal is received over the second transmission line, sending a first notification code to a monitoring station.

18. The method of claim 16, further comprising the step of:

if the timer times out before the signal is received over the second transmission line, sending a second notification code to a monitoring station.

19. The method of claim 16, wherein the signal is an approximately 10 MHz tone.

* * * * *